United States Patent [19]
Landman et al.

[11] Patent Number: 6,028,488
[45] Date of Patent: Feb. 22, 2000

[54] DIGITALLY-CONTROLLED OSCILLATOR WITH SWITCHED-CAPACITOR FREQUENCY SELECTION

[75] Inventors: Paul E. Landman; Wai Lee, both of Plano; John W. Fattaruso, Dallas, all of Tex.

[73] Assignee: Texas Instruments Incorporated, Dallas, Tex.

[21] Appl. No.: 08/960,920

[22] Filed: Oct. 30, 1997

Related U.S. Application Data

[60] Provisional application No. 60/030,723, Nov. 8, 1996, and provisional application No. 60/036,865, Feb. 5, 1997.

[51] Int. Cl.$^7$ .................................................. H03B 5/24
[52] U.S. Cl. .................. 331/1 A; 331/57; 331/36 C; 331/74; 331/34; 327/156; 327/159
[58] Field of Search ............................... 331/1 A, 57, 74, 331/177 R, 36 C, 34; 327/156, 159

[56] References Cited

U.S. PATENT DOCUMENTS

| | | | |
|---|---|---|---|
| 5,281,927 | 1/1994 | Parker | 331/1 A |
| 5,302,920 | 4/1994 | Bitting . | |

FOREIGN PATENT DOCUMENTS

| | | |
|---|---|---|
| 0 563 945 | 10/1993 | European Pat. Off. . |
| 2 288 086 | 10/1995 | United Kingdom . |

OTHER PUBLICATIONS

Dunning et al., "An All–Digital Phase–Locked Loop with 50–Cycle Lock Time Suitable for High–Performance Microprocessors", *J. Solid State Circ.* (IEEE, Apr. 1995), pp. 412–422.

F. Lu, H. Samueli, J. Yuan, and C. Svensson, "A 700–MHz 24–b Pipelined Accumulator in 1.2–um CMOS for Applications as a Numerically Controlled Oscillator," *IEEE Journal of Solid–State Circuits*, vol. 28, No. 8 (IEEE, Aug. 1993), pp. 878–886.

D.–K. Jeong, G. Borriello, D. Hodges, and R. Katz, "Design of PLL–Based Clock Generation Circuits," *IEEE Journal of Solid–State Circuits*, vol. SC–22, No. 2 (Apr. 1987), pp. 255–261.

W. Lindsey and C. Chie, "A Survey of Digital Phase–Locked Loops," *Proceedings of the IEEE*, vol. 69 (Apr. 1981), pp. 410–431.

*Primary Examiner*—Arnold Kinkead
*Attorney, Agent, or Firm*—Ronald O. Neerings; Wade J. Brady, III; Richard L. Donaldson

[57] ABSTRACT

A digitally-controlled oscillator (DCO) (60), such as may be used in clock generator or clock recovery circuitry in an integrated circuit, is disclosed. The disclosed DCO (60) is a single-stage oscillator including a variable load implemented as a binary-weighted array of switched capacitors (40). Each of capacitors (40) has a plate connected to a common node (X), and a plate that receives a signal corresponding to one bit of a digital control word (DCOCW). The common capacitor node (X) is also connected to the input of a Schmitt trigger (42) that produces the output clock signal (OUTCLK) and a feedback signal that is applied to logic (38, 39) that inverts the common node of the capacitors (40). The switching time at the input of Schmitt trigger (42) depends upon the variable load presented by the array of switched capacitors (40), which is controlled by the digital control word (DCOCW). As a result, the clock signal (OUTCLK) is digitally synthesized by a single stage of the DCO (60). A digital phase-locked loop (PLL) clock generator circuit (50) including a phase detector (64), digital loop filter (62) in combination with the DCO (60), and a programmable frequency divider (66) providing a feedback path from the output of the DCO (60) to the phase detector (64), is also disclosed. The PLL clock generator (50) may be used in an integrated circuit such as a digital signal processor (30) or microprocessor, and is particularly well-suited for use in a battery-powered portable electronic system (200).

21 Claims, 7 Drawing Sheets

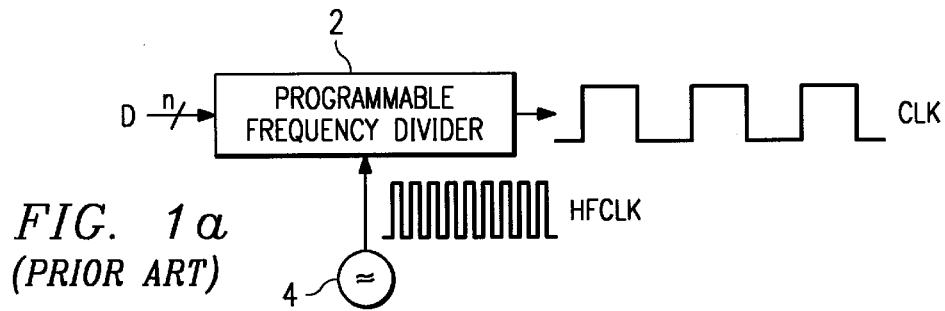
FIG. 1a
*(PRIOR ART)*
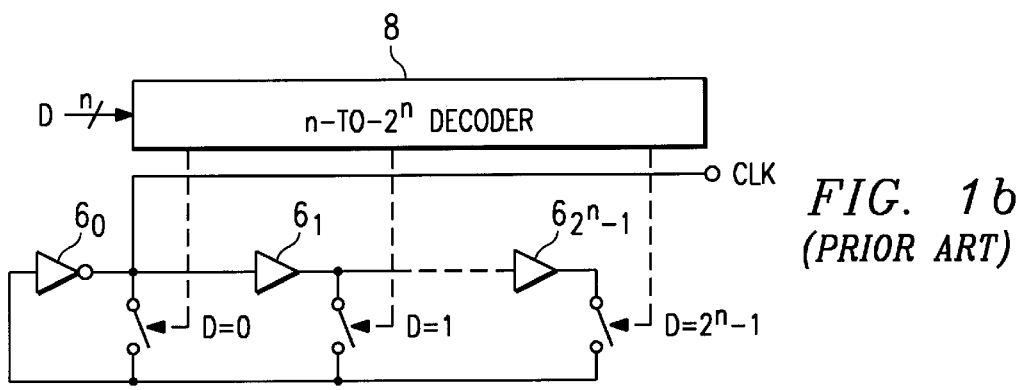
FIG. 1b
*(PRIOR ART)*
FIG. 1c
*(PRIOR ART)*
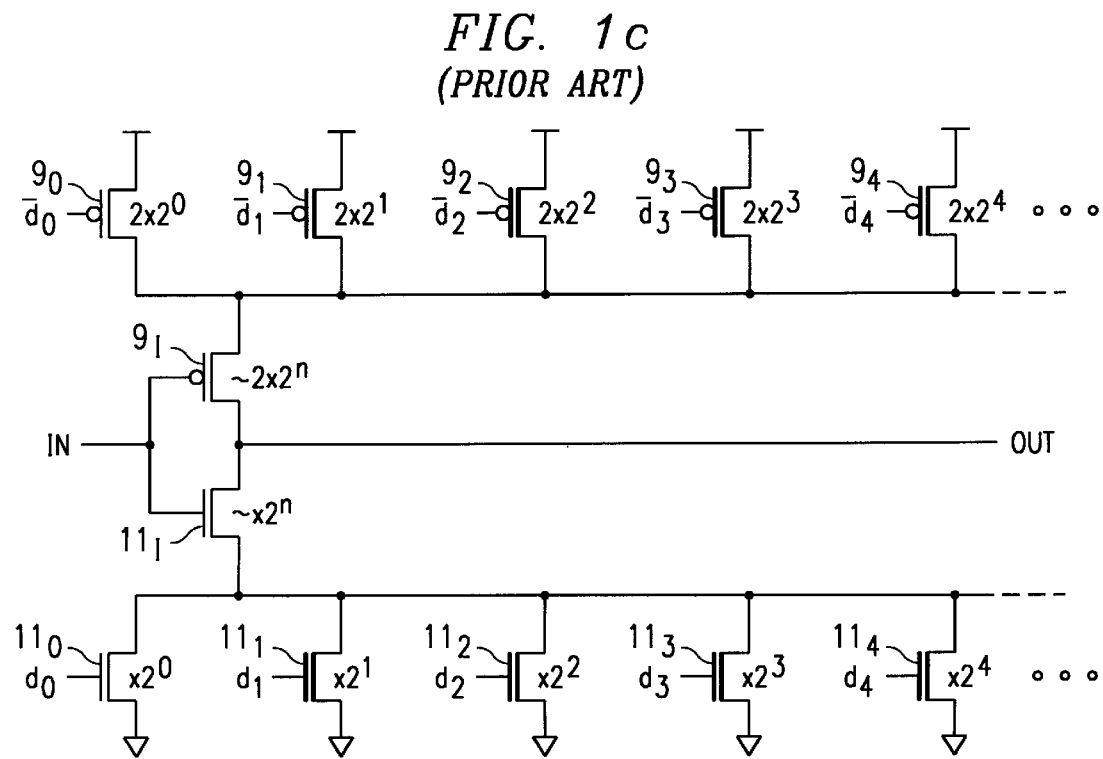

DIGITALLY-CONTROLLED OSCILLATOR WITH SWITCHED-CAPACITOR FREQUENCY SELECTION

CROSS-REFERENCE TO RELATED APPLICATIONS

This application claims the benefit, under 35 U.S.C. §119(e)(1), of U.S. Provisional Application No. 60/030,723, filed Nov. 8, 1996, and of U.S. Provisional Application No. 60/036,865, filed Feb. 5, 1997, both incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to oscillator circuits, such as may be used in clock generation and clock recovery in very large scale integrated (VLSI) logic circuits such as microprocessors and digital signal processors.

As is fundamental in the art, the operating clock rates of modern VLSI circuits, such as microprocessors and digital signal processors (DSPs), have increased greatly over recent years. These clock rates, now up to on the order of hundreds of MHz, and the corresponding increase in the number of operations that can be performed over time by the VLSI circuits, have provided dramatic increases in the functionality of electronic computing systems, including mobile, battery-powered, systems such as notebook computers, wireless telephones, and the like. In order to provide such high speed functionality, functions such as on-chip clock generation and clock recovery (i.e., generation of timing information from serial bitstreams) must of course operate at these high frequencies.

As related to clock generation, the increase in clock frequencies has in turn made the timing constraints for communication among the various integrated circuits more stringent. Particularly in systems that utilize synchronous operation and data communication among multiple integrated circuits, the timing skew between external system clocks and the internal clocks that control the operation of the integrated circuits must be reduced to very small margins.

Conventional systems generally utilize analog PLLs for on-chip generation and synchronization of internal clock signals from system reference clocks. Typical analog PLLs include a phase detector that compares the phase relationship of the reference clock to an internal clock, a charge pump and loop filter for setting an analog voltage corresponding to this phase relationship, and a voltage-controlled oscillator (VCO) for generating an output clock signal in response to the analog voltage from the charge pump and loop filter. In recent years, digital phase detectors have been used in on-chip PLLs in combination with the analog charge pump and filter, and the analog VCO; such PLLs have been referred to as "digital", but of course in reality these PLLs are hybrid digital and analog circuits.

Recently, efforts have been made toward the development of fully digital PLLs. In combination with a digital phase detector, fully digital PLLs include a digital loop filter instead of the traditional analog filter, and include a digitally-controlled oscillator instead of the voltage controlled oscillator. In theory, these fully digital PLLs have several advantages over their analog counterparts. Firstly, digital logic exhibits much better noise immunity than analog circuitry. Secondly, analog components are vulnerable to DC offset and drift phenomena that are not present in equivalent digital implementations. Furthermore, the loop dynamics of analog PLLs are quite sensitive to process technology scaling, whereas the behavior of digital logic remains unchanged with scaling; this requires much more significant redesign effort to migrate analog PLLs to a new technology node than is required for digital PLLs.

Moreover, power dissipation is of extreme concern for portable, battery-powered, computing systems, as power dissipation relates directly to battery life. As a result, many manufacturers are reducing the power supply voltage requirements of the integrated circuits, particularly those that are specially adapted for portable computing systems, to reduce the power consumed by these devices. It has been observed, however, that a reduction in the power supply voltage applied to analog circuitry, such as analog or hybrid PLLs, does not necessarily reduce the power dissipated by these circuits; in some cases, aggressive voltage scaling has been observed to increase the power dissipated by analog circuits. Additionally, reduction in the power supply voltage to analog circuits renders the design of robust circuits much more difficult, given the reduced available "headroom" for the circuits.

For these reasons, PLLs in which digital techniques are used in not only the phase detector, but also in the loop filter and the controllable oscillator, are very attractive to designers. In particular, and as noted above, the implementation of fully digital PLLs to include a digitally-controlled oscillator (DCO), which is an oscillator that operates at a frequency controlled by the value of a digital control word applied thereto, has become especially attractive.

As is known in the art, high frequency circuits other than clock generation circuits also may benefit from the implementation of an all-digital PLL. For example, as noted above, the function of clock recovery (i.e., the extraction of timing information and synchronization from a serial bitstream) is common in effecting high-frequency data communication among integrated circuits and systems. It is, of course, desirable to communicate data at as high a frequency as possible, and as such the frequencies at which clock recovery circuitry are to operate are ever-increasing. Furthermore, considering that communication is a primary function in many battery-powered systems, such as wireless telephones, wireless modems in portable computers, and the like, it is desirable to reduce power dissipation and, consequently, the supply voltage required to implement clock recovery circuits, along with increasing the frequency of operation thereof. As such, many of the advantages provided by fully digital PLLs and the DCOs contained therein are also beneficial to clock recovery circuits, as well as other applications in modern integrated circuits. It should also be noted that the utility of the DCO is not limited to PLL applications. In fact, it is contemplated that any application requiring a frequency-programmable oscillator has the potential to benefit from an efficient implementation of a DCO.

The fundamental function of a DCO is to provide an output waveform, typically in the form of a square wave, which has a frequency of oscillation $f_{DCO}$ that is a function of a digital input word D, as follows:

$$f_{DCO}=f(D)=f(d_{n-1}2^{n-1}+d_{n-2}2^{n-2}+\ldots+d_1 2^1+d_0 2^0)$$

Typically, the DCO transfer function $f(\cdot)$ is defined so that either the frequency $f_{DCO}$ or the period of oscillation $T_{DCO}$ is linear with D, generally with an offset. For example, a DCO transfer function that is linear in frequency is typically expressed as:

$$f(D) = f_{offset} + D \cdot f_{step}$$

where $f_{offset}$ is a constant offset frequency and $f_{step}$ is the frequency quantization step. Similarly, a DCO transfer function that is linear in period is typically expressed as:

$$T(D) = \frac{1}{f(D)} = T_{offset} + D \cdot T_{step}$$

where $T_{offset}$ is a constant offset period and $T_{step}$ is the period quantization step. It is of course evident that, since the DCO period T(D) is a function of a quantized digital input D, the DCO cannot generate a continuous range of frequencies, but rather produces a finite number of discrete frequencies. In this regard, since the quantization granularity of the DCO period sets some fundamental limits on the achievable jitter of a PLL, it is of course desirable to have a fairly small quantization step size (e.g., period quantization step $T_{step}$).

One common type of conventional DCO includes a high-frequency oscillator in combination with a programmable frequency divider. An example of this type of DCO is illustrated in FIG. 1a. In this example, programmable frequency divider 2 receives an n-bit digital word D which indicates the divisor value at which the frequency of the output signal HFCLK of high-frequency oscillator 4 is to be divided in generating the DCO output signal CLK. In this conventional arrangement, the period quantization step $T_{step}$, and thus the lower bound of the timing jitter, is limited to the period of high-frequency oscillator 4. Low jitter operation thus requires oscillator 4 to operate at an extremely high frequency; for example, a 0.2 nsec step between periods requires high frequency oscillator 4 and programmable counter 2 to operate at 5 GHz.

Because of this limitation, other conventional DCO approaches directly synthesize a signal, rather than dividing down from a high frequency source. One example of a conventional direct-synthesis DCO is illustrated in FIG. 1b, which is arranged as a variable length ring oscillator. In this example, $2^n$ delay stages 6 are connected in series, with lowest order stage $6_0$ being an inverting stage and driving the output signal on line CLK. Decoder 8 decodes n-bit digital control word D into $2^n$ control lines, each of which are operable to short out a corresponding stage 6, and one of which is asserted in response to the value of the digital control word D. The period of oscillation T is thus twice the sum of the delays of those delay stages 6 within the ring. For example, if the delay through each stage 6 is $T_6$, in the case where D=0 such that only stage $6_0$ is in the ring, the period of oscillation T will equal $2T_6$; in the case where D=$2^n$–1 (D is at its maximum), the period of oscillation T will equal $2(2^n)T_6$, as all $2^n$ stages 6 will be connected in the ring. In this conventional approach, the period quantization step (which sets a lower bound on the jitter) is thus $2T_6$, or twice the propagation delay of stage 6, which is typically an improvement over that of the conventional DCO of FIG. 1a, but which still may be too coarse for many applications. However, the integrated circuit chip area required for realization of the variable delay ring oscillator of FIG. 1b is substantial, considering that the number of stages 6 is exponential with the number of bits in the control word D and that typical delay stages can be quite complex, with some reported implementations requiring more than twenty transistors per stage. Furthermore, the complexity of decoder 8 is also exponential with n, itself requiring on the order of $(n+6)2^n$ unit-size transistors. The total complexity of the circuit is therefore relatively large, resulting in a chip area that varies with n by on the order of $(n+30)2^n$. Accordingly, a high resolution DCO constructed in this fashion can occupy a tremendous amount of chip area.

Another known approach to implementation of a digital PLL is described in J. Dunning et al., "An All-Digital Phase-Locked Loop with 50-Cycle Lock Time Suitable for High-Performance Microprocessors", *J. Solid State Circ.* (IEEE, April 1995), pp. 412–422. According to this conventional approach, the desired output frequency is directly synthesized through the operation of an eight-stage current-starved ring oscillator, one such stage illustrated in FIG. 1c, where each inverting delay stage includes a pull-up leg of parallel binary-weighted transistors 9, and a pull-down leg of parallel binary-weighted transistors 11. Each transistor $9_i$, $11_i$ is turned on by a corresponding bit $d_i$ (or its complement) of the control word d; switching transistors $9_I$, $11_I$ are controlled by the state of line IN, and drive line OUT at their common drain node. While acceptable frequency resolution is provided according to this approach, the amount of integrated circuit chip area required for implementation of this PLL is extremely large. Since an NMOS transistor $11_i$ weighted by a factor of $2^i$ is generally realized as $2^i$ minimum-size transistors $11_0$ in parallel, the number of unit-size NMOS transistors $11_0$ in a delay stage such as shown in FIG. 1c is $2(2^n)-1$. Assuming a PMOS transistor 9 to be twice the size of its corresponding NMOS transistors 11, the total number of unit-size transistors required to realize the delay stage of FIG. 1c may be considered as:

$$2(2^n)-1+2[2(2^n)-1]=6(2^n)-3$$

For a DCO of this construction having eight delay stages, the area required for implementation will therefore vary with n by on the order of $48(2^n)$.

By way of further background, another example of a conventional digitally-controlled oscillator is described in F. Lu, H. Samueli, J. Yuan, and C. Svensson, "A 700-MHz 24-b Pipelined Accumulator in 1.2-um CMOS for Applications as a Numerically Controlled Oscillator," *IEEE Journal of Solid-State Circuits,* Vol. 28, No. 8 (IEEE, August 1993), pp. 878–886.

BRIEF SUMMARY OF THE INVENTION

It is therefore an object of the present invention to provide a digitally-controlled oscillator (DCO) that can operate at low power supply voltages.

It is a further object of the present invention to provide such a DCO that operates with extremely low levels of jitter.

It is a further object of the present invention to provide such a DCO that requires a relatively modest amount of chip area relative to conventional DCO circuits.

It is a further object of the present invention to provide a digital phase-locked loop (PLL), such as may be used in a very large scale integrated circuit, incorporating such a DCO.

Other objects and advantages of the present invention will be apparent to those of ordinary skill in the art having reference to the following specification together with its drawings.

The present invention may be incorporated into a digital phase-locked loop (PLL) suitable for use in an integrated circuit, such as a digital signal processor. The PLL according to the present invention includes a digital phase-frequency detector, and a digital loop filter, and a digitally-controlled oscillator (DCO), with feedback from the DCO applied to the frequency-phase detector in combination with the input reference clock signal. The DCO is realized by way of a switched-capacitor array that loads a driver within the oscillator. The switched-capacitor array includes a binary-weighted set of capacitors, each of which has its capacitance controlled by one bit of a digital control word from the digital loop filter. The step size between adjacent oscillation periods, and thus the jitter, is defined by the capacitance of the least significant capacitor (corresponding to the LSB of the control word) in combination with the strength of the driver.

BRIEF DESCRIPTION OF THE SEVERAL VIEWS OF THE DRAWING

FIGS. 1a through 1c are electrical diagrams, in block form, of conventional digitally-controlled oscillators.

DETAILED DESCRIPTION OF THE INVENTION

The construction and operation of digitally-controlled oscillator (DCO) 60 according to the preferred embodiment of the present invention will now be described in detail. As will become apparent from the following description, many integrated circuit applications may benefit from the present invention, in that the DCO may be efficiently realized in a modest amount of chip area for a given resolution. Integrated circuits which are to operate at high frequencies while still concerned with power dissipation (and thus operating at low power supply voltages), may also particularly benefit from the present invention. According to the preferred embodiment of the invention, DCO 60 synthesizes a periodic signal on output line DCOCLK at a frequency that is determined by the value of a digital control word on lines DCOCW, in a beneficial manner, as will now be described in detail relative to FIG. 2.

Figure 2:
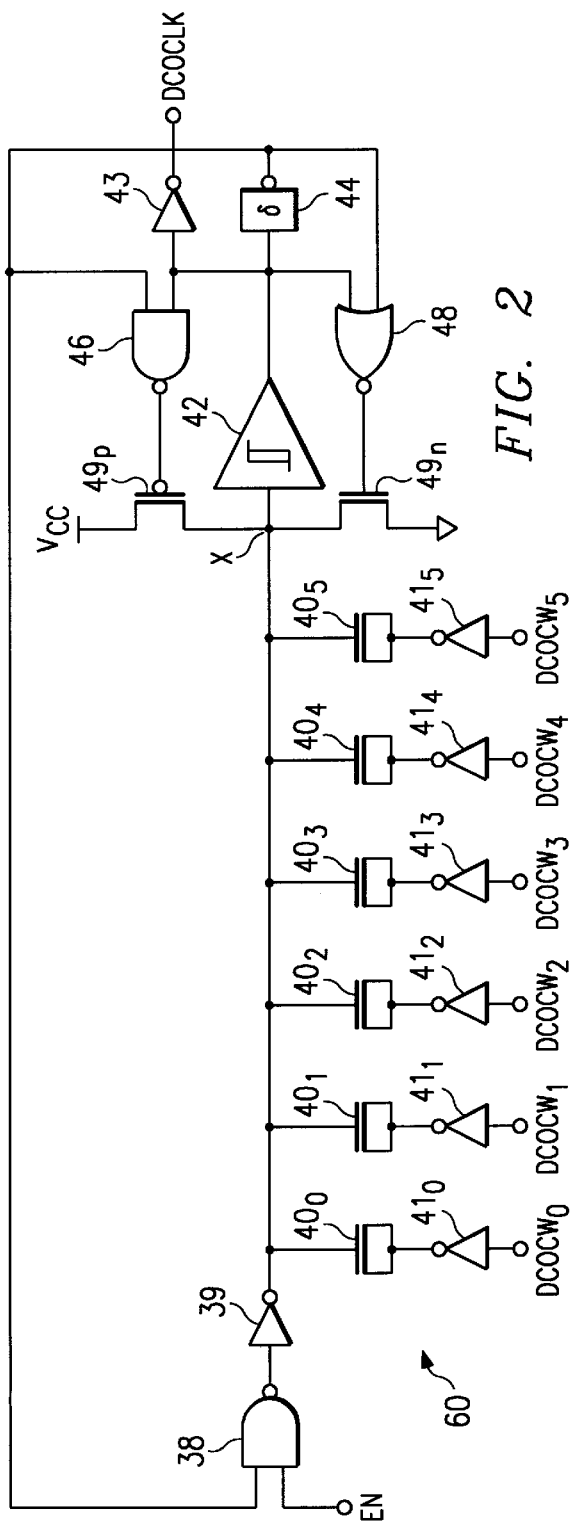
FIG. 2 is an electrical diagram, in schematic form, of a digitally-controlled oscillator (DCO), according to the preferred embodiment of the invention.

FIG. 2 illustrates the construction of DCO 60 according to the preferred embodiment of the invention. DCO 60 is substantially a single-stage oscillator which includes a variable and digitally-controlled load arranged as a binary-weighted array of switched capacitors 40. The number of capacitors 40 depends upon the number of bits in the control word. It will of course be understood by those in the art that the width of the control word (and thus the number of lines DCOCW) may vary, depending upon the frequency range and resolution desired. In this example, six lines $DCOCW_5$ through $DCOCW_0$ are presented to DCO 60, and therefore six capacitors $40_5$ through $40_0$ are included in DCO 60. In any event, the cumulative capacitance of the switched capacitors 40, in their respective states as set by the state of their corresponding control line DCOCW, determines the delay through DCO 60, and thus the frequency of the clock signal on line DCOCLK.

NAND gate 38 in DCO 60 receives an enable signal at one input which, when active, converts NAND gate 38 into an inverter, inverting the state of the feedback signal corresponding to the output clock signal. The output of NAND gate 38, inverted by inverter 39, drives node X which is the common node of a plate of each of capacitors $40_5$ through $40_0$. Node X in turn drives the input of Schmitt trigger 42, which drives inverter 43 and in turn line DCOCLK at its output.

Each of capacitors 40 is preferably implemented as a metal-oxide-semiconductor (MOS) capacitor, in this example as an n-channel MOS transistor with source and drain tied together as one plate, and with its gate as the other plate (specifically, the plate connected to node X); it is of course to be understood that capacitors 40 may be implemented as p-channel MOS transistors, so long as the polarity of the control signals comprehends such implementation.

In this example, the common source/drain regions of each capacitor 40 are driven by one bit of the control word communicated on lines DCOCW, via a corresponding inverter 41 in this example. In the example of FIG. 2, the least significant control word bit, on line $DCOCW_0$, is applied to the common source/drain region of smallest capacitor $40_0$ via inverter $41_0$, while the most significant control word bit, on line $DCOCW_5$, is applied to the common source/drain region of largest capacitor $40_5$, via inverter $41_5$. The voltage applied to the common source/drain region of each capacitor 40 is operable to switch its capacitance from a minimum value to a maximum value. In this embodiment of the invention, an active state (i.e., high voltage) on one of control word lines $DCOCW_i$ will, after inversion by inverter $41_i$, ground the common source/drain region of the corresponding capacitor $40_i$ and create an inversion layer therein, creating a relatively high capacitance; conversely, an inactive state (i.e., low voltage) on control word line $DCOCW_i$ will result in a high voltage applied to the common source/drain region of the corresponding capacitor $40_i$, placing capacitor $40_i$ in the depletion region and significantly reducing its capacitance. Preferably, the off-capacitance $C_{off}$ of each capacitor 40 behaves as:

$$C_{off} \cong \frac{C_{on}}{k}$$

where k>1.

Alternatively, other switched-capacitor implementations may be used in DCO 60 according to the present invention. For example, each capacitor 40 may be implemented as a conventional capacitor, with a series transistor disposed between one plate of the capacitor and node X, controlled by one bit of the control word DCOCW so as to either connect the capacitor to or isolate the capacitor from node X. Other switched-capacitor realizations may also be used in DCO 60, as desirable for a particular implementation.

In this preferred embodiment of the invention, as noted above, capacitors $40_5$ through $40_0$ are binary-weighted relative to one another, such that the capacitance of capacitor $40_1$ (when on) is twice that of capacitor $40_0$ (when on), the capacitance of capacitor $40_2$ (when on) is twice that of capacitor $40_1$ (when on), and so on, such that the capacitance of most significant capacitor $40_5$ (when on) is thirty-two times the capacitance of least significant capacitor $40_0$ (when on). In each case, the capacitance of any one of capacitors 40 when off (i.e., when its corresponding control word line DCOCW is low) is lower than the on capacitance by a factor that is greater than unity. This binary weighting is preferably implemented by selection of the relative sizes of capacitors 40, as conventional integrated circuit processing is eased by using a common dielectric thickness and dielectric constant for each of capacitors 40; in this case, the area of capacitor $40_5$ will be thirty-two times that of capacitor $40_0$, sixteen times that of capacitor $40_1$, and so on. To ensure monotonic performance in the period transfer function, geometry matching considerations are preferably taken into account by setting a lower bound on the size of capacitor $40_0$. Geometry matching is further improved by realizing larger ones of capacitors $40_i$ by multiple (i.e., $2^i$) unit-sized transistors in parallel, laid out according to well-known common-centroid layout techniques; for example, capacitor $40_1$ may be realized by the parallel connection of two transistors of the same size as capacitor $40_0$, capacitor $40_2$ may be realized by the parallel connection of four such transistors, and so on.

Accordingly, the overall capacitance of capacitors 40 is a function of the control word on lines DCOCW. The load presented to inverter 39 will, of course, include the fixed load presented by the input of Schmitt trigger 42 and other parasitic loads in the circuit, in combination with the variable capacitance, and will thus be a linear function of the value of the control word on lines DCOCW. The incremental step size of the clock period from one frequency to another, and thus the jitter of DCO 60, is defined by the drive strength of inverter 39 and the capacitance of the least significant capacitor $40_0$; this capacitor $40_0$ may be made quite small, using modern integrated circuit processing methods and dimension sizes.

Schmitt trigger 42 drives inverter 43, which in turn drives line DCOCLK. The feedback signal applied to NAND gate 38 is also driven by Schmitt trigger 42, via fixed inverting delay stage 44. The delay of delay stage 44 is selected to provide the desired minimum period of oscillation for DCO 60. Reset devices 49p, 49n are large (relative to inverter 39) p-channel and n-channel transistors, respectively, which have their source/drain paths connected in series with one another between power supply voltage $V_{cc}$ and ground, and which have their common drain node at node X. As noted above, the power supply voltage $V_{cc}$ indicated in FIG. 2, and which also biases each of the circuit elements in PLL clock generator 50, may be extremely low in this embodiment of the invention, such as on the order of 1 volt. The gate of reset device 49p is driven by NAND gate 46 which receives the output of Schmitt trigger 42 at one input and the feedback signal from the output of delay stage 44 at its other input; similarly, the gate of reset device 49n is driven by NOR gate 46, which similarly has its inputs driven by the output of Schmitt trigger 42 and the feedback signal from the output of delay stage 44.

Figure 3:
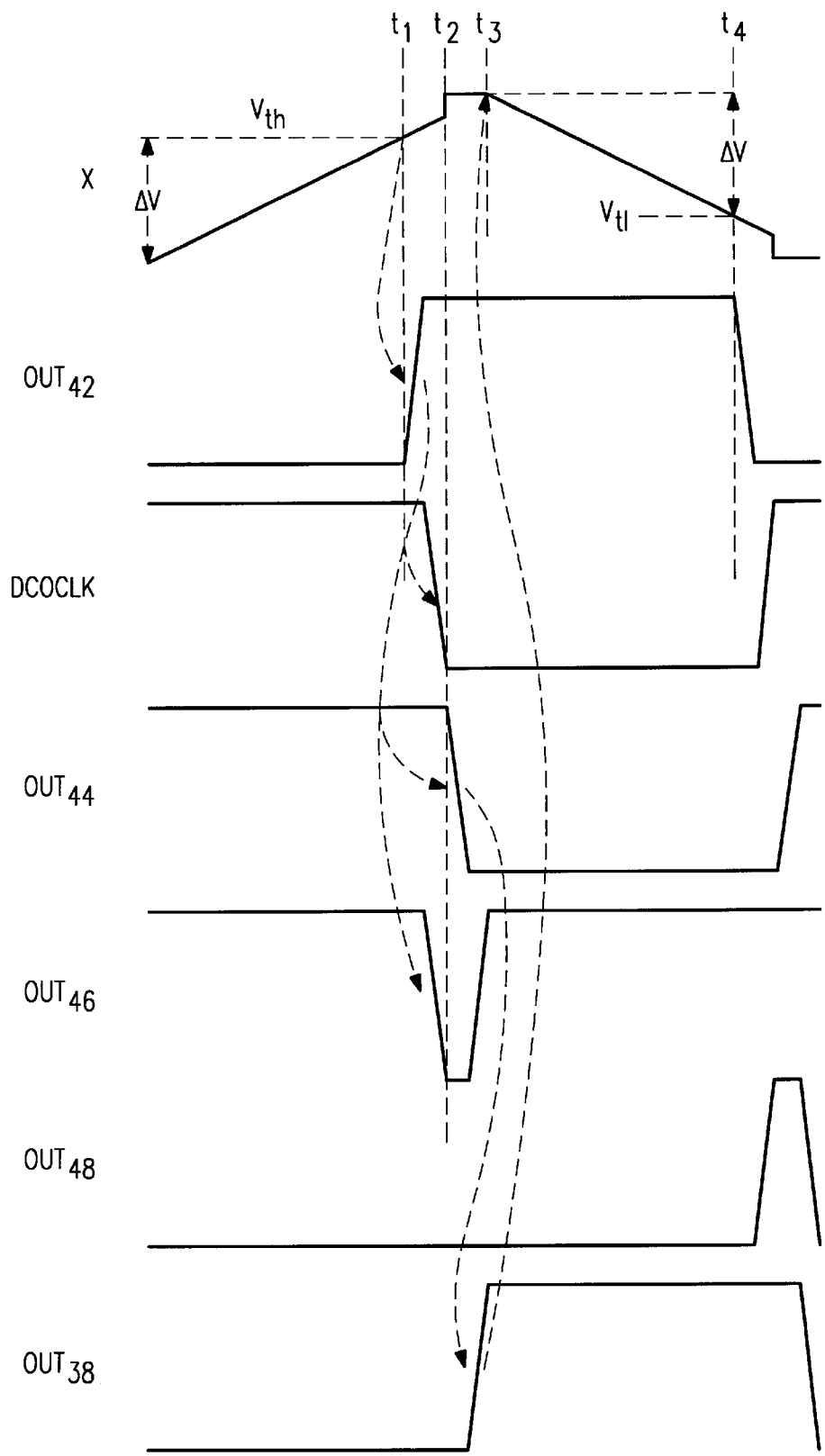
FIG. 3 is a timing diagram illustrating the operation of the digitally-controlled oscillator of FIG. 2.

Referring now to FIG. 3, the operation of DCO 60 according to the preferred embodiment of the present invention will now be described in detail. In operation, Schmitt trigger 42 responds to the voltage at node X reaching its high or low input thresholds, and switches its output accordingly. This operation is illustrated in FIG. 3, which begins with illustrating the voltage on line X increasing toward the high input threshold $V_{th}$ of Schmitt trigger 42. Upon reaching threshold $V_{th}$, which occurs at time $t_1$ in FIG. 3, Schmitt trigger 42 switches the state at its output (line $OUT_{42}$ in FIG. 3), which in turn causes a transition on line DCOCLK via inverter 43 and, via fixed inverting delay stage 44 (as illustrated by line $OUT_{44}$ in FIG. 3), at the input to NAND gate 46.

Reset devices 49p, 49n, along with gates 46, 48, ensure a monotonic and linear response of DCO 60, by driving the transition of node X from rail-to-rail. Schmitt trigger 42, in making a low-to-high transition, as illustrated at time $t_1$ in FIG. 3, applies a high logic level to one input of NAND gate 46, which is in combination with the high logic level remaining at the output of inverting delay stage 44 at this point (the low-to-high transition not having rippled through delay stage 44 yet). These two high levels cause the output of NAND gate 46 (shown on line $OUT_{46}$) to be driven low at time $t_2$ of FIG. 3, turning on transistor 49p and rapidly charging node X to the high power supply voltage $V_{cc}$; the high logic level at the output of Schmitt trigger 42 ensures that NOR gate 48 (line $OUT_{48}$) maintains transistor 49n off during this time. NAND gate 46 turns off transistor 49p once the transition has propagated through delay stage 44; however, node X has been charged to $V_{cc}$ by this time, and remains at this voltage until the next cycle.

The low logic level driven at the output of delay stage 44 (line $OUT_{44}$) is also applied to an input of NAND gate 38, causing a low-to-high transition at its output (line $OUT_{38}$). Inverter 39 in turn begins discharging node X, beginning at time $t_3$, until such time as the voltage reaches the input low threshold $V_{t1}$ of Schmitt trigger 42, which occurs at time $t_4$ in this example. At time $t_4$, Schmitt trigger 42 causes a high-to-low transition at its output, which in turn switches line DCOCLK. The switching of Schmitt trigger 42, in combination with the previous low level at the output of inverting delay stage 44, causes NOR gate 48 to drive a high level at its output (line $OUT_{48}$), which turns on transistor 49n, rapidly discharging node X to ground, until the transition propagates through inverting delay stage 44.

This operation of DCO 60 then continues, cycle after cycle, generating substantially a square wave output clock on line DCOCLK. Reset devices 49p, 49n assist in the operation of DCO 60, particularly in ensuring linear response by driving node X from rail-to-rail as discussed above. Transistors 49p, 49n are sized to ensure that node X is at a rail voltage prior to the switching of NAND gate 38 in the next half-cycle.

The switching time of transitions at node X depends, of course, upon the drive capability of inverter 39 and the load of node X which includes the digitally-controlled variable capacitance $C_X$ presented by capacitors 40 in response to the value of the control word on lines DCOCW from digital loop filter 62. Because the drive of inverter 39 is, of course, fixed, the switching time at node X is linearly controlled by the control word on lines DCOCW, as will now be discussed.

The overall load capacitance $C_X$ at node X, as seen by inverter 39, may be summarized as follows:

$$C_X = C_p + D \cdot C_0 + (2^n - 1 - D)C_{\mathit{off}} = C_p' + \left(\frac{k-1}{k}\right)D \cdot C_0$$

where $C_0$ is the on-capacitance of the least-significant capacitor $40_0$, where $C_p$ is the parasitic capacitance at node X due to inverter 39, Schmitt trigger 42, and reset devices 49p, 49n (i.e., not due to the off capacitances of capacitors 40), and where $C_{\mathit{off}}$ is the off-capacitance of the least-significant capacitor $40_0$ (which is a factor k>1 less than the on-capacitance, as noted above). D corresponds to the value of the digital control word on lines DCOCW. This assumes that the capacitances of all of capacitors 40 are binary-weighted in both of the on and off states. In this example, the value n is six, as control word DCOCW has six lines. The capacitance $C'_p$ is a combined parasitic capacitance, including both the actual parasitic capacitance and also the cumulative off-capacitances of capacitors 40, as determined by control word DCOCW:

$$C'_p = C_p + (2^n - 1)C_{\mathit{off}}$$

One may now readily derive the variable delay $T_{var}$ of inverter 39 driving node X as follows, as a function of the change $\Delta V$ in voltage required at node X to switch from the supply rails to the thresholds $V_{th}$, $V_{t1}$, at an average drive current $I^{ave}$:

$$T_{\text{var}} = \frac{C_X \Delta V}{I^{ave}} = \frac{C_p' \Delta V}{I^{ave}} + \left[\frac{\left(\frac{k-1}{k}\right)C_0 \Delta V}{I^{ave}}\right]D$$

This variable delay $T_{var}$ is thus a linear function of the value D of control word DCODW, such that the oscillation period $T_{DCO}$ of DCO 60 may be expressed as:

$$T_{DCO} = T(D) = T_{\mathit{offset}} + D \cdot T_{\mathit{step}}$$

where $T_{\mathit{offset}}$ is the minimum synthesizable period (occurring for D=0) and where $T_{\mathit{step}}$ is the quantization step size between periods, which is related to the average drive current $I^{ave}$ and to the capacitance $C_0$ of the least significant capacitor $40_0$ in DCO 60. The minimum period $T_{\mathit{offset}}$ thus is twice the sum of the propagation delays through NAND gate 38, inverter 39, Schmitt trigger 42, and fixed delay stage 44, considering that one cycle corresponds to two transitions, considering the capacitance of capacitors 40 when all in their off state. These values are within the control of the designer, as are the drive of inverter 39, the capacitance $C_0$ of least significant capacitor $40_0$, which determine the quantization period step size $T_{\mathit{step}}$. It is contemplated that those of ordinary skill in the art will be readily able to select the appropriate values for these parameters.

It is therefore contemplated that DCO 60 according to the preferred embodiment of the invention is particularly beneficial in providing a high-resolution clock signal that is controlled by a digital control word, and which is operable at high frequencies and low power supply voltages.

Furthermore, it is contemplated that DCO 60 is particularly well-suited for efficient implementation into modern integrated circuits, given that it is a single stage oscillator that is controlled responsive to a relatively small series of capacitors 40. As a result, the single delay stage implemented within DCO 60 can be much smaller than conventional designs, considering that the number of large, exponentially-scaled, devices is sharply reduced. Relative to the conventional design of FIG. 1c, for example, where many NMOS and PMOS binary-weighted transistors are present in each delay stage, DCO 60 according to this embodiment of the invention utilizes a single set of binary-weighted transistors to control the frequency of oscillation. Specifically, the switched-capacitor array requires on the order of $2^n-1$ unit size transistors and, as will be described below, the remaining circuitry requires on the order of $2^n$ unit size transistors. Thus, the total area of DCO 60 is on the order of $2(2^n)$ transistors, which is more than an order of magnitude smaller than existing DCOs according to conventional technology.

More specifically, to further illustrate the chip area efficiency provided by DCO 60 according to this embodiment of the invention, an extrapolation of the number of unit size transistors for one exemplary implementation of DCO 60 will now be described. As noted above, the array of switched capacitors 40 requires $2^n-1$ unit-size transistors serving as capacitors $40_0$. In this particular implementation, the remainder of the realization of DCO 60 was sized to drive this load, and as such the area required for the surrounding circuitry may be specified as multiples of unit size transistors as follows:

| Component | Unit-size transistor count |
| --- | --- |
| Capacitors 40 | $2^n$ |
| Drivers 41 | $\frac{1}{2}2^n$ |
| Inverter 39 | $\frac{1}{16}2^n$ |
| Schmitt trigger 42 | $\frac{1}{16}2^n$ |
| Fixed delay 44 | $\frac{1}{16}2^n$ |
| NAND 38 | $\frac{1}{16}2^n$ |
| Reset devices 49 | $\frac{1}{8}2^n$ |
| NAND 46 and NOR 48 | $\frac{1}{8}2^n$ |
| Driver 43 | 3 |
| Total | $2(2^n) + 3$ |

In summary, DCO 60 according to the preferred embodiment is contemplated to be more than an order of magnitude smaller, in chip area, than conventional DCOs with comparable frequency resolution.

It is further contemplated that DCO 60 is particularly well-suited for high performance operation, since the period quantization step $T_{\mathit{step}}$ may be made arbitrarily small through selection of the minimum capacitor $40_0$ in combination with selection of the drive strength of inverter 39.

The benefits of the present invention are applicable to many integrated circuit applications, including clock recovery and the like. By way of example, the implementation of DCO 60 according to the preferred embodiment of the invention within a clock generator circuit, as may be used in a VLSI integrated circuit such as a digital signal processor (DSP) or microprocessor will now be described.

Figure 4:
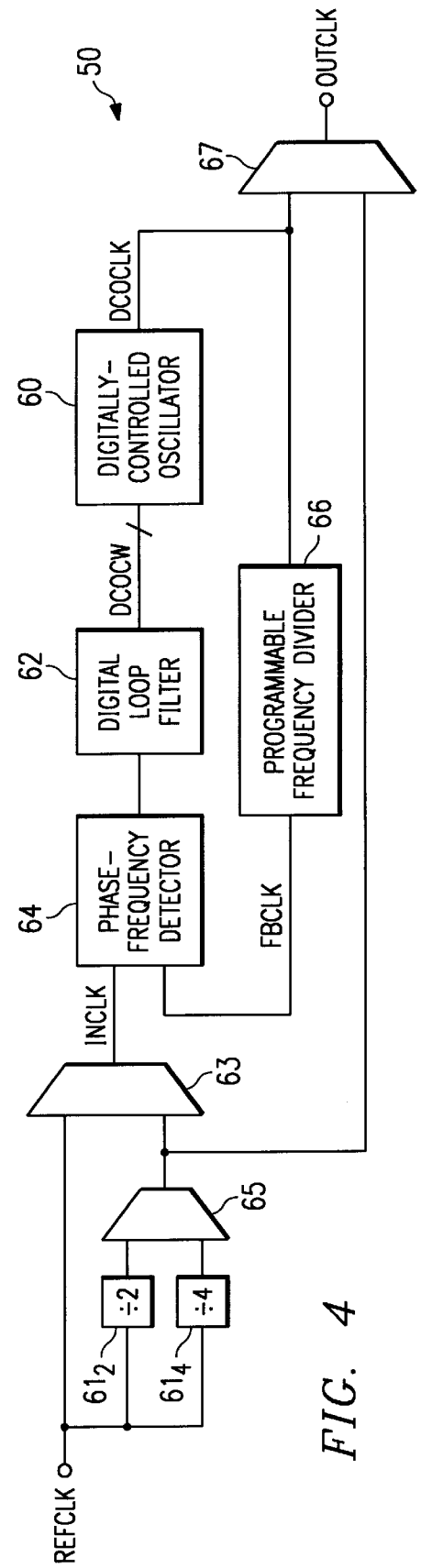
FIG. 4 is an electrical diagram, in block form, of the digital phase-locked loop (PLL) clock generator constructed according to the preferred embodiment of the invention.

FIG. 4 illustrates the construction of PLL clock generator 50 according to the preferred embodiment of the present invention. PLL clock generator 50 is based upon digitally-controlled oscillator (DCO) 60, which generates an output clock signal DCOCLK responsive to the state of an n-bit digital control word presented at inputs thereof by digital loop filter 62. Digital loop filter 62 presents, at its output on lines DCOCW, an n-bit digital control word to DCP 60 responsive to receipt of a control signal from phase-frequency detector 64 that corresponds to the phase relationship between clock signals on lines INCLK and FBCLK.

The clock signal on line INCLK, as presented at an input of phase-frequency detector 64, is derived from the clock signal on line REFCLK and, in this exemplary realization, may correspond to the fundamental frequency of the clock signal on line REFCLK, or to ½ frequency or ¼ frequency versions thereof. In this embodiment of the invention, line REFCLK is applied to frequency dividers $6_{12}$, $6_{14}$ which respectively generate a ½ frequency clock signal and a ¼ frequency clock signal based upon the signal on line REFCLK. Multiplexer 65 receives the ½ frequency clock signal and ¼ frequency clock signal from frequency dividers 61, and selects between these signals in response to a control signal (not shown). The output of multiplexer 65 is applied to an input of multiplexer 63, a second input of which directly receives the clock signal on line REFCLK; multiplexer 63 is accordingly controlled by a control signal (not shown) to present the selected clock signal to phase-frequency detector 64 on line INCLK. The combination of frequency dividers 61 and multiplexer 63, 65 permit the system to select the frequency of the clock signal used in the generation of the output clock signal on line DCOCLK, and thus on line OUTCLK.

Additionally, the output of multiplexer 65 is forwarded to an input of multiplexer 67. Multiplexer 67 receives line DCOCLK from the output of DCO 60 at its other input, and is controlled by a control signal (not shown) to forward either the clock signal on line DCOCLK or the clock signal at the output of multiplexer 65 to line OUTCLK, for use elsewhere within the integrated circuit. As such, this embodiment of the invention permits selection of the actual internal clock between a clock signal based directly upon the reference input clock signal on line REFCLK and the PLL output clock signal on line DCOCLK.

As noted above, phase-frequency detector 64 receives a second input clock signal on line FBCLK from programmable frequency divider 66. Programmable frequency divider 66 is a frequency divider that divides the frequency of the clock signal on line DCOCLK to a frequency useful in the phase detection comparison performed by phase-frequency detector 64. Examples of conventional frequency dividers useful as programmable frequency divider 66 according to the preferred embodiment of the invention are described in U. Rohde, *Digital PLL Frequency Synthesizers* (Prentice-Hall: Englewood Cliffs, N.J., 1983), and in V. Manassewitsch, *Frequency Synthesizers,* (Wiley: New York, 1997). The selection of the frequency divider ratio is made by way of a control word (not shown) that is applied to programmable frequency divider 66. For example, it is contemplated that programmable frequency divider 66 may be programmed to divide down the frequency of the signal on line DCOCLK by integer multiples from unity to fifteen.

The construction of PLL clock generator 50, and particularly the construction of the individual component blocks thereof according to the preferred embodiment of the present invention, will now be described in detail. The construction of PLL clock generator 50 as will now be described is provided by way of example, it being understood that variations in the construction and operation of the particular component portions of PLL clock generator 50 will become apparent to those of ordinary skill in the art having reference to this description.

Phase-frequency detector 64, according to the preferred embodiment of the present invention, may be constructed according to any one of a number of types of phase detection circuitry known in the art. An example of a conventional digital phase detector is described in D.-K. Jeong, G. Borriello, D. Hodges, and R. Katz, "Design of PLL-Based Clock Generation Circuits," *IEEE Journal of Solid-State Circuits,* vol. SC-22, No. 2 (April 1987), pp. 255–261. It is contemplated that the construction of phase-frequency detector 64 according to this approach will provide excellent performance, and as such is particularly well-suited for high frequency circuitry such as PLL clock generator 50 including DCO 60 constructed according to the preferred embodiment of the present invention.

According to this example, phase-frequency detector 64 detects the phase relationship between edges of the clock signals on lines INCLK and FBCLK, it being readily apparent to those of ordinary skill in the art that the selection of edges for which the phase comparison is to be made will depend upon minor changes in the combinational logic used to realize phase-frequency detector 64. In operation, phase-frequency detector 64 will generate signals indicating the phase relationship between these clock signal edges, and communicates these signals to digital loop filter 62.

Figure 5:
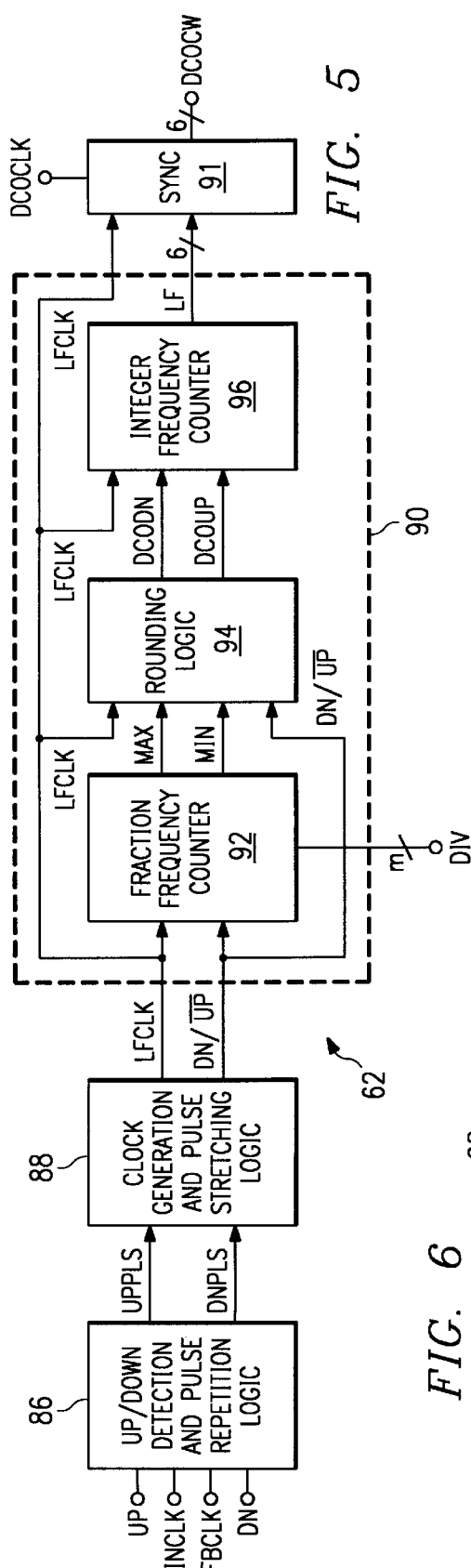
FIG. 5 is an electrical diagram, in block form, of the digital loop filter in the digital PLL clock generator according to the preferred embodiment of the invention.

Referring now to FIG. 5, the construction and operation of loop filter 62 will now be described. Digital loop filter 62 may be implemented according to any one of a number of conventional designs. Examples of digital loop filters useful in connection with PLL clock generator 50 are described in W. Lindsey and C. Chie, "A Survey of Digital Phase-Locked Loops," *Proceedings of the IEEE,* vol. 69 (April 1981), pp. 410–431, and in R. E. Best, Phase-Locked Loops: Theory, Design, and Applications, 3rd edition, New York: McGraw-Hill, 1997.

As illustrated in FIG. 5, loop filter 62 receives signals on lines UP, DN, from phase-frequency detector 64, and converts these signals into a digital control word on lines DCOCW that controls the frequency of oscillation of DCO 60 (see FIG. 4). According to the preferred embodiment of the invention, loop filter 62 is made up of four stages, namely up/down detection and pulse repetition logic 86, clock generation and pulse stretching logic 88, digital low-pass filter 90, and synchronizer 91, as will be described below. While it is of course contemplated that digital loop filters according to other conventional approaches may alternatively be used, the arrangement of loop filter 62 according to this exemplary embodiment of the invention is preferred, due to its excellent performance in finely setting the oscillation frequency of DCO 60 in response to extremely small pulses on lines UP, DN.

Up/down detection and pulse repetition logic 86, as noted above, receives one or both of each of the pairs of lines UP, DN, which may be presented in complementary form if desired. Up/down detection and pulse repetition logic 86, according to this embodiment of the invention, includes logic circuitry for generating pulses of fixed duration responsive to activating transitions on lines UP, DN. Additionally, up/down detection and pulse repetition logic 86 also preferably receives the clock signals on lines INCLK and FBCLK, and uses these clock signals to generate repetitive pulses on the appropriate lines of UPPLS, DNPLS in the event that signals on lines UP, DN remain asserted for long periods of time, as occurs when clock signals on lines INCLK, FBCLK have a significant frequency difference therebetween.

Figure 6:
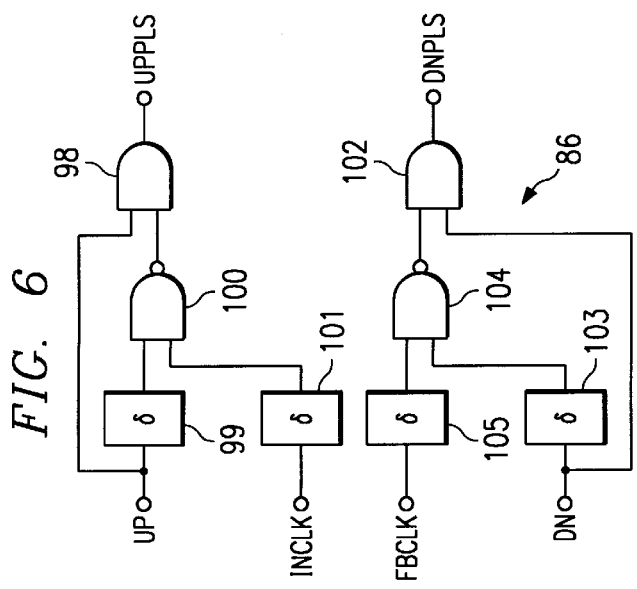
FIG. 6 is an electrical diagram, in schematic form, of up/down detection and pulse repetition logic in the digital loop filter of the digital PLL clock generator according to the preferred embodiment of the invention.

For example, referring to FIG. 6, AND gate 98 receives line UP at one input, and the output of NAND gate 100 at another input, and generates a pulse on line UPPLS at its output. NAND gate 100 receives line UP (delayed by delay stage 99) at one input and line INCLK (delayed by delay stage 101) at another input. The propagation delays through delay stages 99, 101 are selected to account for any arrival time mismatch between the signals on lines UP, INCLK. In operation, AND gate 98 generates a pulse on line UPPLS responsive to a low-to-high transition on line UP, until such time as the transition has propagated through delay stage 99 and NAND gate 100. If the pulse on line UP remains at an active level for several cycles of the clock signal on line INCLK, each cycle of the clock signal on line INCLK will, via delay stage 101 and NAND gate 100, cause additional transitions at the output of AND gate 98 on line UPPLS, with a frequency corresponding to that of the input clock on line INCLK.

The construction and operation of up/down detection and pulse repetition logic 86 for generating a pulse on line DNPLS is similar, with line DN fed forward to one input of AND gate 102, and coupled to a second input of AND gate 102 via delay stage 103 and NAND gate 104; clock line FBCLK is applied to the second input of NAND gate 104 through delay stage 105. Similarly, therefore, a pulse will appear on line DNPLS in response to each pulse on line DN and, if line DN remains active for some time, with each cycle of the clock signal on line FBCLK.

Figure 7:
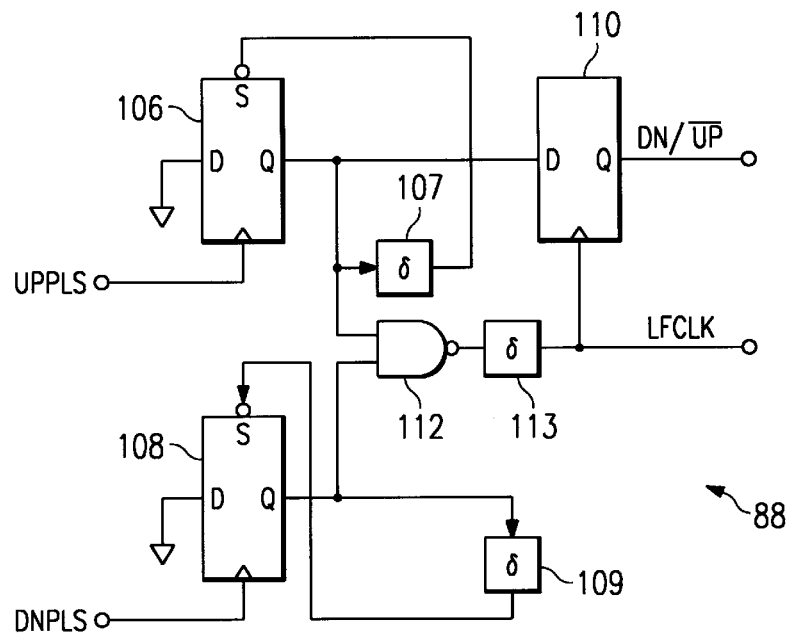
FIG. 7 is an electrical diagram, in schematic form, of clock generation and pulse stretching logic in the digital loop filter of the digital PLL clock generator according to the preferred embodiment of the invention.

Clock generation and pulse stretching logic 88 receives the signals on lines UPPLS, DNPLS, and generates a loop filter clock signal on line LFCLK in response to a rising edge on either of lines UPPLS, DNPLS, in combination with a level on line DN/$\overline{UP}$ to indicate the phase difference polarity as indicated by whether the pulse is on line UPPLS or DNPLS. For example, as illustrated in FIG. 7, clock generation and pulse stretching logic 88 includes latches 106, 108 which have clock inputs connected to lines UPPLS, DNPLS, respectively, have data inputs biased low, and which have active-low set inputs connected to their respective Q outputs via delay stages 107, 109, respectively. The Q outputs of latches 106, 108 are applied to NAND gate 112, the output of which drives the clock input of latch 110 and the loop filter clock on line LFCLK, via delay stage 113. Latch 110 receives the state of the Q output of latch 106 at its input, and drives line DN/$\overline{UP}$ with its output.

In operation, each pulse on line UPPLS will clock latch 106 to store a low logic level, and each pulse on line DNPLS will clock latch 108 to store a low logic level. The input pulse will cause the Q output of the corresponding one of latches 106, 108 to switch the output of NAND gate 112 to a high logic level, generating a pulse on line LFCLK (after the delay of delay stage 113) clocking in the state of the Q output of latch 106 into latch 110 which then appears on line DN/$\overline{UP}$. Accordingly, if line UPPLS caused the pulse on line LFCLK, the Q output of latch 110 will be low, while the Q output of latch 110 will remain high if a pulse on line DNPLS caused the LFCLK pulse. The switching one of latches 106, 108 will then set its Q output high again, following the delay period through delay stages 107, 109. Lines DN/$\overline{UP}$ and LFCLK are then forwarded to low-pass filter 90.

Low pass filter 90, according to this embodiment of the invention, generates, in combination with synchronizer 91, generates a six-bit control word on lines DCOCW to DCO 60 (FIG. 4), in response to the series of logic levels on line DN/$\overline{UP}$ over a series of pulses of the loop filter clock on line LFCLK. This six-bit control word sets the oscillation frequency of DCO 60, and thus the frequency of the clock signal on lines DCOCLK and OUTCLK. According to this embodiment of the invention, low pass filter 90 is of the proportional and integral type.

Figure 8:
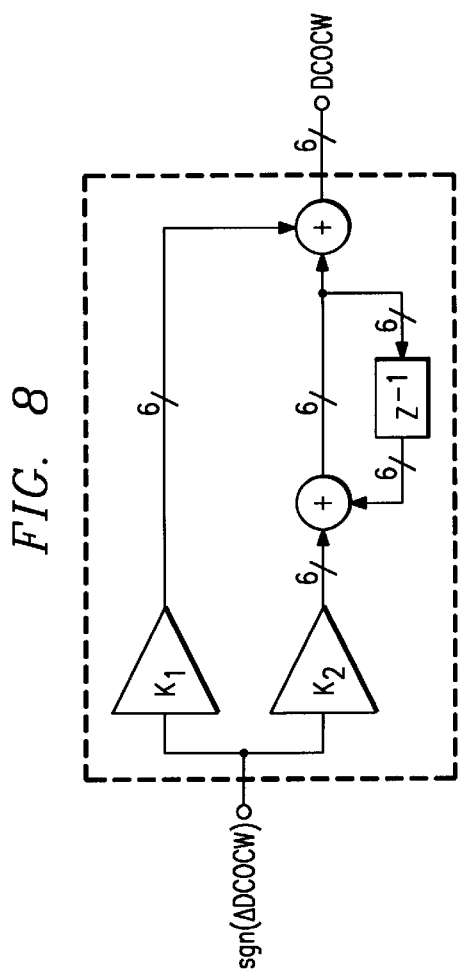
FIG. 8 is a model of the low-pass filter in the digital PLL clock generator according to the preferred embodiment of the invention.

According to the preferred embodiment of the invention, low pass filter 90 may be modeled in the manner illustrated in FIG. 8, in which a one-bit input on line sgn(ΔDCOCW) specifies the sign or polarity of the change required in the DCO control word DCOCW to correct the phase error between the clock signals on lines INCLK and FBCLK, where sgn(ΔDCOCW) is +1 if line DN/$\overline{UP}$ is high (i.e., FBCLK leads INCLK), and −1 if line DN/$\overline{UP}$ is low (i.e., FBCLK lags INCLK). The output control word from the model of FIG. 8 is a six-bit digital representation that corresponds to the following Z-transform domain relationship:

$$DCOCW[5:0] = K_1 \cdot sgn(\Delta DCOCW) + \frac{K_2 \cdot sgn(\Delta DCOCW)}{1 - z^{-1}}$$

According to the preferred embodiment of the invention, the values of coefficients $K_1$, $K_2$ may be obtained for a given realization through a combination of analytical and empirical approaches, including an initial derivation of an approximate phase transfer function, followed by phase-step, frequency-step and frequency-ramp stability simulations, such simulations well known in the art. It was observed that the optimal values of coefficients $K_1$, $K_2$ differ according to the divisor of programmable frequency divider 66 (FIG. 4), as this divisor directly impacts the loop gain of PLL clock generator 50. According to the preferred embodiment of the invention, the preferred values of coefficients $K_1$, $K_2$ for a range of divisor N values of 1 to 15, as described hereinabove for programmable frequency divider 66, are as follows:

| N | $K_1$ | $K_2$ |
|---|---|---|
| 1–2 | ½ | 1/32 |
| 3–8 | ½ | 1/16 |
| 9–15 | ½ | 1/8 |

The selection of powers of two in the denominator of the values of coefficients $K_1$, $K_2$ was made to simplify the hardware realization of low pass filter 90.

Certain hardware constraints were observed in connection with the present invention, because of the use of fractional values of coefficients $K_1$, $K_2$ in low pass filter 90 in combination with a finite number of frequency quantization levels in digital PLL clock generator 50, including the necessity to split low pass filter 90 into separate integer and fractional portions. Referring back to FIG. 5, low pass filter 90 according to the preferred embodiment of the invention includes fraction frequency counter 92, which receives the signals on lines DN/$\overline{UP}$, LFCLK. Based upon the state on line DN/$\overline{UP}$ at each pulse of the loop filter clock on line LFCLK, fraction frequency counter 92 accumulates partial frequency steps and indicates, by way of signals on lines MAX, MIN, that the accumulated fractional frequency has achieved the maximum (1-$K_2$) or minimum (0) values, respectively. According to this embodiment of the invention, the value of the divisor by way of which programmable frequency divider 66 (FIG. 4) divides the frequency on line DCOCLK to generate FBCLK is forwarded to fraction frequency counter 92 on lines DIV, such that the maximum fractional value (1-$K_2$) may be determined. It is contemplated that fractional frequency counter 92 may be implemented by way of a 5-bit accumulator (given the smallest possible value for coefficient $K_2$ is 1/32) that is incremented or decremented with each pulse on line LFCLK, depending upon the state on line DN/$\overline{\text{UP}}$. Wrap-around detection examines the number of LSBs of this accumulator indicated by the value on lines DIV to determine if the maximum or minimum values have been reached.

Figure 9:
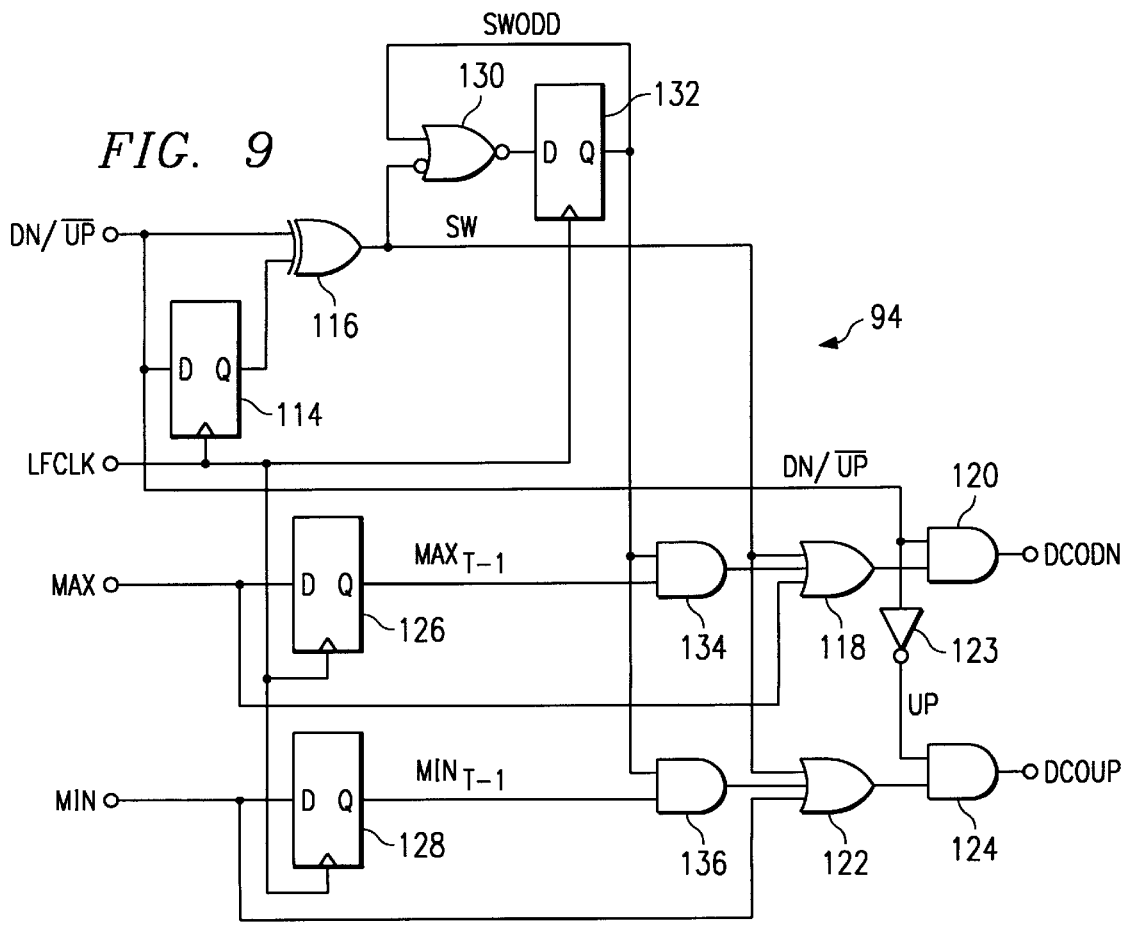
FIG. 9 is an electrical diagram, in schematic form, of rounding logic in the digital loop filter of the digital PLL clock generator according to the preferred embodiment of the invention.

Rounding logic 94 receives the signals on lines MAX, MIN from fraction frequency counter 92, along with the signals on lines DN/$\overline{\text{UP}}$, LFCLK. Rounding logic 94 determines whether the most recent frequency correction requires adjustment of the current integer portion of the frequency value and, if so, issues a signal on one of lines DCODN (for a downward frequency adjustment) or DCOUP (for an upward frequency adjustment). FIG. 9 illustrates an exemplary implementation of rounding logic 94 according to the preferred embodiment of the invention, in which the integer portion adjustment signals on lines DCODN, DCOUP are generated in response to a direction change in the frequency correction signal on line DN/$\overline{\text{UP}}$, in response to a fractional frequency wrap-around situation indicated by the signals on lines MAX, MIN, and also in the event of a direction change following a wrap-around situation as will be described hereinbelow.

As illustrated in FIG. 9, latch 114 has a clock input that receives the loop filter clock on line LFCLK and has a D input receiving line DN/$\overline{\text{UP}}$; as such, latch 114 stores the state of line DN/$\overline{\text{UP}}$ from the previous cycle of the loop filter clock, and applies this state to an input of exclusive-OR gate 116. Exclusive-OR 116 receives the current state of line DN/$\overline{\text{UP}}$ at its other input, and drives line SW with an active level in the event that the current and prior states of line DN/$\overline{\text{UP}}$ differ from one another, which corresponds to a change in direction in the frequency correction signal. Line SW is applied to inputs of OR gates 118, 122, the output of which are applied to an input of AND gates 120, 124, respectively. AND gate 120 receives line DN/$\overline{\text{UP}}$ at a second input, and drives line DCODN at its output; similarly, AND gate 124 receives the complement of line DN/$\overline{\text{UP}}$ (via inverter 123) at its second input, and drives line DCOUP at its output. Accordingly, a change in direction of the frequency correction signal (as indicated on line SW) is fed forward, via OR gates 118, 122, to generate an integer adjustment signal on one of lines DCODN, DCOUP, depending upon the current state of the frequency correction signal on line DN/$\overline{\text{UP}}$.

Line MAX is also fed forward to an input of OR gate 118, and line MIN is fed forward to an input of OR gate 122. Accordingly, in the event that line MAX is asserted by fractional frequency counter 92, in combination with the frequency correction direction on line DN/$\overline{\text{UP}}$ indicating that the current frequency correction signal is down, AND gate 120 will issue an integer adjustment signal on line DCODN; this combination corresponds to the desired frequency decreasing into the next integer range. Conversely, in the event that line MIN is asserted, in combination with the frequency correction signal on line DN/$\overline{\text{UP}}$ indicating that the current frequency correction direction is up, AND gate 124 will issue an integer adjustment signal on line DCOUP; this combination corresponds to the desired frequency increasing into the next integer range.

It has been observed, in connection with the present invention, that inaccuracy can arise in the event that a direction change in the frequency correction signal immediately follows a wrap-around event. While the directional change is fed forward (on line SW in the implementation of FIG. 9), this single increment or decrement is not sufficient to reverse the effect from the immediately preceding wrap-around event. In particular, any odd number of direction changes immediately following a wrap-around event will have this undercorrection; in contrast, an even number of direction changes due to wrap-arounds will have canceled one another out.

Rounding logic 94 thus includes latches 126, 128, each of which are clocked by the loop filter clock on line LFCLK to store the state of lines MAX, MIN for an additional cycle; the Q outputs of latches 126, 128 are presented, on lines MAX$_{T-1}$ and MIN$_{T-1}$, respectively, to inputs of respective AND gates 134, 136, indicating the state of lines MAX and MIN in the previous loop filter clock cycle. An indication of whether an odd number of directional changes has occurred is generated by the combination of NOR gate 130 and latch 132. NOR gate 130 receives line SW at an inverting input, and the Q output of latch 132 at a non-inverting input, and drives the D input of latch 132 from its output; latch 132 is clocked by the loop filter clock on line LFCLK. The Q output of latch 132 drives line SWODD, which is applied to inputs of AND gates 134, 136. Because of this arrangement, line SWODD is driven active in response to a current directional switch, indicated on line SW, being an odd-numbered switch in a sequence; if such is the case, in combination with one of lines MAX$_{T-1}$ and MIN$_{T-1}$ being active to indicate a wrap-around event in the preceding loop filter clock cycle, the corresponding one of OR gates 118, 122 drives its output high to cause the generation of the appropriate one of lines DCODN, DCOUP, if enabled by the current direction of line DN/$\overline{\text{UP}}$. For example, if the current directional change to a down direction is odd-numbered and the previous cycle included a wrap-around to the maximum (MAX$_{T-1}$ is active), an integer adjustment on line DCODN will be generated, providing the additional necessary adjustment in this case.

Integer frequency counter 96 in low pass filter 90 receives the signals on lines DCODN, DCOUP from rounding logic 94, and maintains a saturating digital count corresponding to the frequency at which DCO 60 (FIG. 4) is to operate. In this embodiment of the invention, DCO 60 operates according to one of sixty-four cycle periods as indicated by a digital word on six lines DCOCW from synchronizer 91. Accordingly, integer frequency counter 96 includes a six-bit counter that is decreased upon receipt of a pulse on line DCOUP and increased upon receipt of a pulse on line DCODN, considering that the counter stores cycle period rather than cycle frequency. Saturation logic in integer frequency counter 96 maintains the maximum and minimum counter values, to preclude against the cycle period "wrapping around" in the event of overflow or underflow conditions.

The contents of integer frequency counter 96 are presented on lines LF to synchronizer 91, which synchronizes the state of lines LF with the clock signal on line DCOCLK. This synchronization is preferably performed in such a manner as to block the clock signal on line DCOCLK from latching the states of lines LF for a brief time after a rising edge of the loop filter clock on line LFCLK, to avoid the latching of unstable states on lines LF. Synchronizer 91 presents the synchronized contents of integer frequency counter 96 to DCO 60 on lines DCOCW.

Referring back to FIG. 4, DCO 60 generates a periodic signal on line DCOCLK that has a frequency controlled by the digital signal on lines DCOCW from digital loop filter 62. According to the preferred embodiment of the invention, DCO 60 synthesizes the periodic signal on line DCOCLK in a beneficial manner, in the manner described in detail hereinabove relative to FIG. 4, with a frequency controlled by the digital signal on lines DCOCW from digital loop filter 62.

The overall operation of PLL clock generator 50 according to the preferred embodiment of the present invention will now be described in detail, in connection with FIG. 4, and the detailed construction illustrated in FIGS. 4 through 9. Firstly, PLL clock generator 50 is configured, by way of control signals, to set various conditions. In the example of FIG. 4, multiplexers 63, 65 are controlled in order to select the appropriate clock signal based upon the system reference clock on line REFCLK (i.e., fundamental, half-frequency, or quarter-frequency) for use as the input clock signal on line INCLK. Programmable frequency divider 66 is also configured to divide the frequency of the clock signal on line DCOCLK, in generating the feedback clock signal on line FBCLK. For a given divisor N, the negative feedback loop comprised of phase-frequency detector 64, digital loop filter 62, DCO 60, and programmable frequency divider 66 will eventually cause PLL clock generator 50 to generate a clock signal of frequency $f_{DCO}$ on line DCOCLK to follow the relationship:

$$\frac{f_{DCO}}{N} = f_{INCLK}$$

where $f_{INCLK}$ is the frequency of the input clock signal on line INCLK.

Upon configuration of PLL clock generator 50 as noted above, operation begins with phase-frequency detector 64 comparing the relative position of a transition of the clock signal on line INCLK to a transition of the feedback clock signal on line FBCLK. The various components within PLL clock generator 50 will have been initialized by this time, for example by way of an enable signal and associated circuitry (not shown in FIGS. 4 through 9 for purposes of clarity), such that DCO 60 begins operation at an initial frequency, generating a feedback clock signal on line FBCLK. During the initial stages of the lock-in process, multiplexer 67 may be controlled to select the output of multiplexer 65 for use as the clock signal on line OUTCLK, if desired.

The result of the phase comparison by phase-frequency detector 64 is communicated on lines UP, DN, as noted above. In this example, if the clock signal on line INCLK leads the feedback clock signal on line FBCLK, phase-frequency detector 64 drives active signals on lines UP and $\overline{UP}$; conversely, if the clock signal on line INCLK lags the feedback clock signal on line FBCLK, phase-frequency detector 64 drives active signals on lines DN and $\overline{DN}$. These signals are received by digital loop filter 62, in a synchronous manner through its generation of the loop filter clock signal on line LFCLK (see FIG. 7), to realize a first-order low-pass digital filter (such as according to the model illustrated in FIG. 8). As described hereinabove, digital loop filter 62 according to the preferred embodiment of the invention includes low-pass filter 90 constructed with fractional and integer portions; fractional frequency counter 92 is incremented and decremented according to the directional signals and, through rounding logic 94, controls the adjustment of integer frequency counter 96. The output of integer frequency counter 96 is synchronized by synchronizer 91 with the feedback clock signal on line FBCLK to prevent mid-cycle frequency changes, and gated relative to the loop filter clock on line LFCLK, to avoid instability. The output of digital loop filter 62 is a digital control word on lines DCOCW.

DCO 60 applies the control word on lines DCOCW to the binary-weighted array of switched capacitors 40, to adjust the variable load presented within the single oscillator stage. This variable load controls the switching time at the input of Schmitt trigger 42, which in turn drives a square wave signal with a period corresponding to the control word on lines DCOCW. This square wave signal appears on line DCO-CLK which, after division by programmable frequency divider 66, is applied to phase-frequency detector 64 on line FBCLK, and the process continues until lock-in.

The PLL clock generator according to the present invention provides important advantages, not only in the generation of on-chip clock signals, but also in systems utilizing the same. Firstly, the output clock signal generated by the PLL clock generator is directly synthesized to have the desired frequency, rather than being derived from a high frequency source. This direct synthesizing enables the use of extremely small incremental frequency changes, selected by the implementation of capacitors with small sizes, without requiring the implementation of high frequency oscillators as used in conventional DCOs. Furthermore, the use of the binary-weighted switched capacitor array to synthesize the clock signal is extremely efficient in chip area, as compared to other direct synthesis oscillators, such as those using current controlled delay stages.

Figure 10:
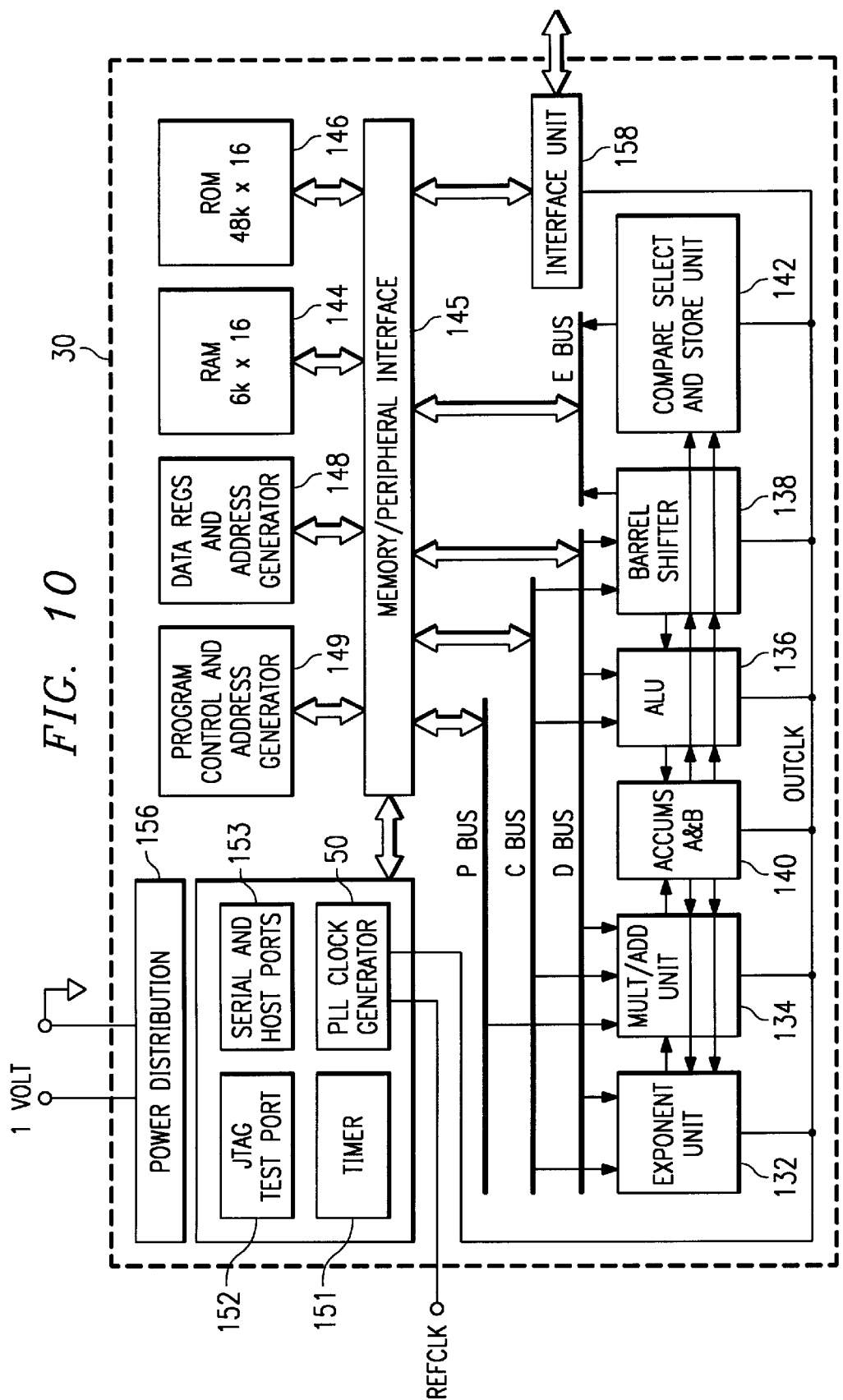
FIG. 10 is an electrical diagram, in block form, of a digital signal processor (DSP), in which a digital phase-locked loop clock generator circuit constructed according to the preferred embodiment of the invention is implemented.

An example of a VLSI integrated circuit into which PLL clock generator 50 according to the preferred embodiment of the invention may be implemented is illustrated in FIG. 10. The architecture illustrated in FIG. 10 for DSP 30 is presented by way of example, as it will be understood by those of ordinary skill in the art that the present invention may be implemented into integrated circuits of various functionality and architecture, including custom logic circuits, general purpose microprocessors, and other VLSI and larger integrated circuits.

DSP 30 in this example is implemented by way of a modified Harvard architecture, and as such utilizes three separate data buses C, D, E that are in communication with multiple execution units including exponent unit 132, multiply/add unit 134, arithmetic logic unit (ALU) 136, and barrel shifter 138. Accumulators 140 permit operation of multiply/add unit 134 in parallel with ALU 136, allowing simultaneous execution of multiply-accumulate (MAC) and arithmetic operations. The instruction set executable by DSP 30, in this example, includes single-instruction repeat and block repeat operations, block memory move instructions, two and three operand reads, conditional store operations, and parallel load and store operations, as well as dedicated digital signal processing instructions. DSP 30 also includes compare, select, and store unit (CSSU) 142, coupled to data bus E, for accelerating Viterbi computation, as useful in many conventional communication algorithms.

DSP 30 in this example includes significant on-chip memory resources, to which access is controlled by memory/peripheral interface unit 145, via data buses C, D, E, and program bus P. These on-chip memory resources include random access memory (RAM) 144, read-only memory (ROM) 146 used for storage of program instructions, and data registers 148; program controller and address generator circuitry 149 is also in communication with memory/peripheral interface 145, to effect its functions. Interface unit 58 is also provided in connection with memory/peripheral interface to control external communications, as do serial and host ports 153. Additional control functions such as timer 151 and JTAG test port 152 are also included in DSP 30.

According to this preferred embodiment of the invention, the various logic functions executed by DSP 30 are effected in a synchronous manner, according to one or more internal system clocks generated by PLL clock generator 50, constructed as described hereinabove. In this exemplary implementation, PLL clock generator 50 directly or indirectly receives an external clock signal on line REFCLK, such as is generated by other circuitry in the system or by a crystal oscillator or the like, and generates internal system clocks, for example the clock signal on line OUTCLK, communicated (directly or indirectly) to each of the functional components of DSP 30.

DSP 30 also includes power distribution circuitry 156 for receiving and distributing the power supply voltage and reference voltage levels throughout DSP 30 in the conventional manner. As indicated in FIG. 10, DSP 30 according to the preferred embodiment of the present invention may be powered by extremely low power supply voltage levels, such as on the order of 1 volt. This reduced power supply voltage is of course beneficial in maintaining relatively low power dissipation levels, and is in large part enabled by the construction and operation of PLL clock generator 50, which generates stable and accurate internal clock signals even with such low power supply voltages.

Figure 11:
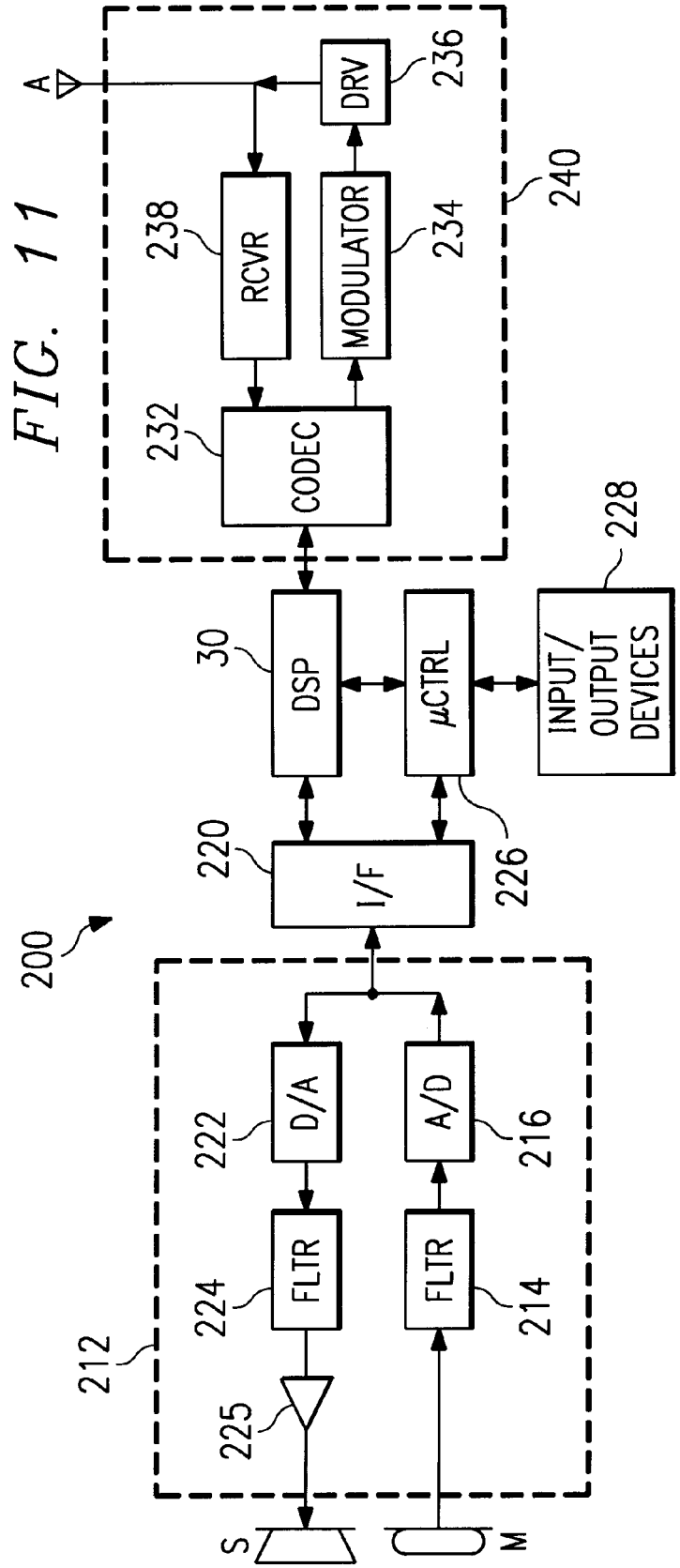
FIG. 11 is an electrical diagram, in block form, of an exemplary battery-powered computing system, implemented as a wireless telephone, including the DSP of FIG. 10, constructed according to the preferred embodiment of the invention.

Referring now to FIG. 11, an example of an electronic computing system constructed according to the preferred embodiment of the present invention will now be described in detail. Specifically, FIG. 11 illustrates the construction of a wireless communications system, namely a digital cellular telephone handset 200 constructed according to the preferred embodiment of the invention. It is contemplated, of course, that many other types of communications systems and computer systems may also benefit from the present invention, particularly those relying on battery power. Examples of such other computer systems include personal digital assistants (PDAs), portable computers, and the like. As power dissipation is also of concern in desktop and line-powered computer systems and microcontroller applications, particularly from a reliability standpoint, it is also contemplated that the present invention may also provide benefits to such line-powered systems.

Handset 200 includes microphone M for receiving audio input, and speaker S for outputting audible output, in the conventional manner. Microphone M and speaker S are connected to audio interface 212 which, in this example, converts received signals into digital form and vice versa. In this example, audio input received at microphone M is processed by filter 214 and analog-to-digital converter (ADC) 216. On the output side, digital signals are processed by digital-to-analog converter (DAC) 222 and filter 224, with the results applied to amplifier 225 for output at speaker S.

The output of ADC 216 and the input of DAC 222 in audio interface 212 are in communication with digital interface 220. Digital interface 220 is connected to microcontroller 226 and to digital signal processor (DSP) 30, constructed as described hereinabove relative to FIG. 10, by way of separate buses in the example of FIG. 11.

Microcontroller 226 controls the general operation of handset 200 in response to input/output devices 228, examples of which include a keypad or keyboard, a user display, and add-on cards such as a SIM card. Microcontroller 226 also manages other functions such as connection, radio resources, power source monitoring, and the like. In this regard, circuitry used in general operation of handset 200, such as voltage regulators, power sources, operational amplifiers, clock and timing circuitry, switches and the like are not illustrated in FIG. 11 for clarity; it is contemplated that those of ordinary skill in the art will readily understand the architecture of handset 200 from this description.

In handset 200 according to the preferred embodiment of the invention, DSP 30 is connected on one side to interface 220 for communication of signals to and from audio interface 212 (and thus microphone M and speaker S), and on another side to radio frequency (RF) circuitry 240, which transmits and receives radio signals via antenna A. Conventional signal processing performed by DSP 30 may include speech coding and decoding, error correction, channel coding and decoding, equalization, demodulation, encryption, voice dialing, echo cancellation, and other similar functions to be performed by handset 200.

RF circuitry 240 bidirectionally communicates signals between antenna A and DSP 30. For transmission, RF circuitry 240 includes codec 232 which codes the digital signals into the appropriate form for application to modulator 234. Modulator 234, in combination with synthesizer circuitry (not shown), generates modulated signals corresponding to the coded digital audio signals; driver 236 amplifies the modulated signals and transmits the same via antenna A. Receipt of signals from antenna A is effected by receiver 238, which applies the received signals to codec 232 for decoding into digital form, application to DSP 30, and eventual communication, via audio interface 212, to speaker S.

The benefits provided by the digitally-controlled oscillator according to the present invention translate into important system benefits as may be enjoyed by wireless communications systems such as handset 200 of FIG. 11, as well as other battery-powered devices such as portable computer systems. In particular, the efficiency of the PLL clock generator in chip area permits low-cost implementation of the DCO into modern integrated circuits, thus enabling use of the present invention in highly complex integrated circuits such as digital signal processors. Use of the DCO in this manner avoids the implementation of analog PLL circuitry, and thus permits the application of low power supply voltages, such as on the order of 1 volt, without loss of accuracy in the on-chip clock generation. As a result, the present invention is particularly important when applied into battery-powered systems, such as wireless telephones, portable computers, and the like.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A digitally-controlled oscillator, comprising:
   a plurality of switched capacitors, each of the plurality of capacitors coupled to a common node, for presenting a capacitance to the common node responsive to the state of an associated bit of a digital control word;
   output circuitry, having an input coupled to the common node, and having an output for driving an output clock signal, said output circuitry comprising a Schmitt trigger having an input coupled to the common node; and
   inverting feedback logic, comprising:
      a fixed delay stage, having an input coupled to an output of the Schmitt trigger; and
      a driver, having an input coupled to an output of the fixed delay stage, and having an output coupled to the common node.

2. The digitally-controlled oscillator of claim 1, wherein each of the plurality of switched capacitors has a first plate coupled to receive a signal corresponding to the associated bit of the digital control word, and has a second plate connected in common with the second plate of others of the plurality of capacitors at the common node.

21

3. The digitally-controlled oscillator of claim 2, wherein each of the plurality of switched capacitors comprises a metal-oxide-semiconductor transistor having a source and a drain region connected together as the first plate, and having a gate electrode as the second plate.

4. The digitally-controlled oscillator of claim 1, wherein the plurality of switched capacitors are of varying capacitance values relative to one another.

5. The digitally-controlled oscillator of claim 4, wherein the plurality of switched capacitors comprise:
- a first capacitor having a unit size, and associated with a least significant bit of the digital control word;
- at least one larger capacitor, each of the at least one larger capacitors associated with a more significant bit of the digital control word, and comprised of a plurality of capacitors of unit size connected in parallel.

6. The digitally-controlled oscillator of claim 4, wherein the capacitance values of the plurality of switched capacitors vary in a binary-weighted fashion.

7. The digitally-controlled oscillator of claim 6, wherein each of the plurality of switched capacitors has a first plate coupled to receive a signal corresponding to the associated bit of the digital control word, and has a second plate connected in common with the second plate of others of the plurality of switched capacitors at the common node;
and wherein the first plate of a smallest of the plurality of switched capacitors is coupled to receive a least significant bit of the digital control word, and the first plate of a largest of the plurality of switched capacitors is coupled to receive a most significant bit of the digital control word.

8. The digitally-controlled oscillator of claim 1, further comprising:
- first and second reset transistors, each having a conduction path and a control terminal, the conduction paths of the first reset transistor connected between a power supply voltage and the common node, and the conduction path of the second reset transistor connected between the common node and a reference voltage;
- reset logic, having an input coupled to the output of the Schmitt trigger, and having outputs coupled to the control terminals of the first and second reset transistors, for turning on the first reset transistor responsive to a transition at the output of the Schmitt trigger indicating that the voltage at the common node has reached a first threshold of a logic level corresponding to the power supply voltage, and for turning on the second reset transistor responsive to a transition at the output of the Schmitt trigger indicating that the voltage at the common node has reached a second threshold of a logic level corresponding to the reference voltage.

9. The digitally-controlled oscillator of claim 8, wherein the reset logic also has an input coupled to the output of the fixed delay stage, and turns off the first and second reset transistors responsive to a transition at the output of the fixed delay stage.

10. A digital phase-locked loop circuit, comprising:
- a phase-frequency detector, having inputs receiving an input clock signal and a feedback clock signal, for detecting a phase relationship between the input clock signal and the feedback clock signal;
- a loop filter, coupled to the phase-frequency detector, for adjusting a digital control word responsive to the detected phase relationship;
- a digitally-controlled oscillator, comprising:
    - a plurality of switched capacitors, each of the plurality of capacitors coupled to a common node, for presenting a capacitance to the common node responsive to the state of an associated bit of the digital control word;
    - output circuitry, having an input coupled to the common node coupling the plurality of capacitors, and having an output for driving an output clock signal, said output circuitry comprising a Schmitt trigger having an input coupled to the common node coupling the plurality of capacitors;
    - inverting feedback logic having an input coupled to the common node and having an output for driving the common node to a complementary voltage, said inverting feedback logic comprising:
        - a fixed delay stage, having an input coupled to the output of the Schmitt trigger; and
        - a driver, having an input coupled to an output of the fixed delay stage and having an output coupled to the common node: and
- feedback circuitry, having an input coupled to an output of the driver circuitry, and having an output for presenting the feedback clock signal to the phase-frequency detector.

11. The digital phase-locked loop circuit of claim 10, wherein each of the plurality of switched capacitors has a first plate coupled to receive a signal corresponding to the associated bit of the digital control word, and has a second plate connected in common with the second plate of others of the plurality of capacitors at the common node.

12. The digital phase-locked loop circuit of claim 11, wherein each of the plurality of switched capacitors comprises a metal-oxide-semiconductor transistor having a source and a drain region connected together as the first plate, and having a gate electrode as the second plate.

13. The digital phase-locked loop circuit of claim 10, wherein the plurality of switched capacitors are of varying capacitance values relative to one another.

14. The digital phase-locked loop circuit of claim 13, wherein the plurality of switched capacitors comprise:
- a first capacitor having a unit size, and associated with a least significant bit of the digital control word;
- at least one larger capacitor, each of the at least one larger capacitors associated with a more significant bit of the digital control word, and comprised of a plurality of capacitors of unit size connected in parallel.

15. The digital phase-locked loop circuit of claim 13, wherein the capacitance values of the plurality of switched capacitors vary in a binary-weighted fashion;
wherein each of the plurality of switched capacitors has a first plate coupled to receive a signal corresponding to the associated bit of the digital control word, and has a second plate connected in common with the second plate of others of the plurality of switched capacitors at the common node;
and wherein the first plate of a smallest of the plurality of switched capacitors is coupled to receive a least significant bit of the digital control word, and the first plate of a largest of the plurality of switched capacitors is coupled to receive a most significant bit of the digital control word.

16. The digital phase-locked loop circuit of claim 10, wherein the digitally-controlled oscillator further comprises:
- first and second reset transistors, each having a conduction path and a control terminal, the conduction path of the first reset transistor connected between a power supply voltage and the common node, and the conduction path of the second reset transistor connected between the common node and a reference voltage;

reset logic, having an input coupled to the output of the Schmitt trigger, and having outputs coupled to the control terminals of the first and second reset transistors, for turning on the first reset transistor responsive to a transition at the output of the Schmitt trigger indicating that the voltage at the common node has reached a first threshold of a logic level corresponding to the power supply voltage, and for turning on the second reset transistor responsive to a transition at the output of the Schmitt trigger indicating that the voltage at the common node has reached a second threshold of a logic level corresponding to the reference voltage.

17. The digital phase-locked loop circuit of claim 16, wherein the reset logic also has an input coupled to the output of the fixed delay stage, and turns off the first and second reset transistors responsive to a transition at the output of the fixed delay stage.

18. The digital phase-locked loop circuit of claim 10, wherein the feedback circuitry comprises a programmable frequency divider.

19. An electronic system, comprising:

at least one input/output device; and an integrated circuit, coupled to the at least one input/output device, and comprising:

functional circuitry, for executing logical operations upon digital data signal in a synchronous fashion according to an internal clock signal;

power distribution circuitry, coupled to a battery, for distributing power to the functional circuitry; and a digital phase-locked loop circuit for generating the internal clock signal, comprising:

a phase-frequency detector, having inputs receiving an input clock signal and a feedback clock signal, for detecting a phase relationship between the input clock signal and the feedback clock signal;

a loop filter, coupled to the phase-frequency detector, for adjusting a digital control word responsive to the detected phase relationship;

a digitally-controlled oscillator, comprising:

a plurality of switched capacitors, each of the plurality of capacitors coupled to a common node, for presenting a capacitance to the common node responsive to the state of an associated bit of the digital control word;

output circuitry, having an input coupled to the common node, and having an output for driving an output clock signal, said output circuitry comprising:

a Schmitt trigger having an input coupled to the common node coupling the plurality of capacitors;

an inverting feedback logic wherein the inverting feedback logic comprises:

a fixed delay stage, having an input coupled to the output of the Schmitt trigger; and a driver, having an input coupled to an output of the fixed delay stage, and having an output coupled to the common node;

wherein the digitally-controlled oscillator further comprises:

first and second reset transistors, each having a conduction path and a control terminal, the conduction path of the first reset transistor connected between a power supply voltage and the common node, and the conduction path of the second reset transistor connected between the common node and a reference voltage;

reset logic, having an input coupled to the output of the Schmitt trigger, and having outputs coupled to the control terminals of the first and second reset transistors, for turning on the first reset transistor responsive to a transition at the output of the Schmitt trigger indicating that the voltage at the common node has reached a first threshold of a logic level corresponding to the power supply voltage, and for turning on the second reset transistor responsive to a transition at the output of the Schmitt trigger indicating that the voltage at the common node has reached a second threshold of a logic level corresponding to the reference voltage;

and wherein the reset logic also has an input coupled to the output of the fixed delay stage, and turns off the first and second reset transistors responsive to a transition at the output of the fixed delay stage; and the inverting feedback logic, having an input coupled to the common node and having an output for driving the common node to a complementary voltage; and feedback circuitry, having an input coupled to an output of the driver circuitry, and having an output for presenting the feedback clock signal to the phase-frequency detector.

20. The system of claim 19, wherein each of the plurality of switched capacitors has a first plate coupled to receive a signal corresponding to the associated bit of the digital control word, and has a second plate connected in common with the second plate of others of the plurality of capacitors at the common node.

21. The system of claim 19, wherein the capacitance values of the plurality of switched capacitors vary in a binary-weighted fashion;

wherein each of the plurality of switched capacitors has a first plate coupled to receive a signal corresponding to the associated bit of the digital control word, and has a second plate connected in common with the second plate of others of the plurality of switched capacitors at the common node;

and wherein the first plate of a smallest of the plurality of switched capacitors is coupled to receive a least significant bit of the digital control word, and the first plate of a largest of the plurality of switched capacitors is coupled to receive a most significant bit of the digital control word.

* * * * *

UNITED STATES PATENT AND TRADEMARK OFFICE
CERTIFICATE OF CORRECTION

PATENT NO.   : 6,028,488
DATED        : February 22, 2000
INVENTOR(S)  : Paul E. Landman, Wai Lee, John W. Fattaruso, and Michiel de Wit It is certified that error appears in the above-identified patent and that said Letters Patent is hereby corrected as shown below:

<u>Title page,</u>
Item [75] Inventor, an inventor has been omitted:

-- Paul E. Landman; Wai Lee, both of Plano; John W. Fattaruso; and Michiel de Wit, both of Dallas, all of Texas --.

Signed and Sealed this

Fifth Day of February, 2002

*Attest:*

JAMES E. ROGAN
*Attesting Officer*     *Director of the United States Patent and Trademark Office*